(12) United States Patent
Byun et al.

(10) Patent No.: US 9,973,199 B2
(45) Date of Patent: May 15, 2018

(54) TOUCH PROCESSOR CIRCUIT AND TOUCH SCREEN SYSTEM PERFORMING ANALOG-TO-DIGITAL CONVERSION OF TWO STEPS

(71) Applicant: SAMSUNG ELECTRONICS CO., LTD., Suwon-si, Gyeonggi-do (KR)

(72) Inventors: San-Ho Byun, Bucheon-si (KR); Chadong Kim, Gwacheon-si (KR); Jinchul Lee, Seoul (KR); Bumsoo Kim, Seoul (KR); Junchul Park, Daegu (KR); Kyeonggon Lee, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 9 days.

(21) Appl. No.: 15/199,010

(22) Filed: Jun. 30, 2016

(65) Prior Publication Data

US 2017/0003810 A1    Jan. 5, 2017

(30) Foreign Application Priority Data

Jul. 2, 2015 (KR) .................. 10-2015-0094808

(51) Int. Cl.
*G06F 3/044* (2006.01)
*H03M 1/08* (2006.01)
*H03M 3/00* (2006.01)

(52) U.S. Cl.
CPC .............. *H03M 1/08* (2013.01); *G06F 3/044* (2013.01); *H03M 3/464* (2013.01)

(58) Field of Classification Search
None
See application file for complete search history.

(56) References Cited

U.S. PATENT DOCUMENTS 6,191,723 B1    2/2001    Lewis
8,040,142 B1    10/2011   Bokma et al.
(Continued)

FOREIGN PATENT DOCUMENTS

CN        105404410 A       3/2016
KR     10-2016-0028932 A    3/2016

OTHER PUBLICATIONS

Jeroen De Maeyer et al., "A Double-Sampling Extended-Counting ADC" IEEE Journal of Solid-State Circuits, p. 411-418; Mar. 3, 2004.

*Primary Examiner* — Seokyun Moon
(74) *Attorney, Agent, or Firm* — Lee & Morse, P.C.

(57) ABSTRACT

A touch processor circuit includes a capacitance-to-voltage converter and an analog-to-digital converter. The capacitance-to-voltage converter converts an input signal transmitted from a touch sensor into a conversion signal corresponding to a capacitance of the touch sensor. The analog-to-digital converter digitizes the conversion signal transmitted from the capacitance-to-voltage converter and generates a digital value. The analog-to-digital converter includes a first converter, a second converter, and a combination logic circuit. The first converter calculates upper bits of the digital value based on the conversion signal during a first time period. The second converter calculates lower bits of the digital value based on a residue component signal transmitted from the first converter during a second time period. The combination logic circuit combines the upper bits and the lower bits and generates the digital value.

18 Claims, 13 Drawing Sheets

(56) References Cited

U.S. PATENT DOCUMENTS

| | | | |
|---|---|---|---|
| 8,321,174 B1 | 11/2012 | Moyal et al. | |
| 2013/0100069 A1* | 4/2013 | Kwon | G06F 3/044 345/174 |
| 2014/0077823 A1 | 3/2014 | Angelini et al. | |
| 2014/0152612 A1* | 6/2014 | Choi | G06F 3/044 345/174 |
| 2014/0232890 A1 | 8/2014 | Yoo et al. | |
| 2015/0381200 A1* | 12/2015 | Goto | H03M 3/458 341/143 |
| 2016/0070381 A1 | 3/2016 | Park et al. | |

* cited by examiner

FIG. 9

| | | | | | |
|---|---|---|---|---|---|
| SW4n | ON | OFF | ON | OFF | ... |
| SW4p | OFF | ON | OFF | ON | ... |
| SW5n | OFF | ON | OFF | ON | ... |
| SW5p | ON | OFF | ON | OFF | ... |
| V− | Cs1 | Cs2 | Cs1 | Cs2 | ... |
| V+ | Cs2 | Cs1 | Cs2 | Cs1 | ... | t0　t1　t2　t3　t4 → Time

TOUCH PROCESSOR CIRCUIT AND TOUCH SCREEN SYSTEM PERFORMING ANALOG-TO-DIGITAL CONVERSION OF TWO STEPS

CROSS-REFERENCE TO RELATED APPLICATION

Korean Patent Application No. 10-2015-0094808, filed on Jul. 2, 2015, in the Korean Intellectual Property Office, and entitled: "Touch Processor Circuit and Touch Screen System Performing Digital-to-Analog Conversion of Two Steps," is incorporated by reference herein in its entirety.

BACKGROUND

1. Field

The present disclosure relates to an electronic circuit and an electronic system, and more particularly, relates to a touch processor circuit that is configured to sense an action accompanying a contact or proximity toward a touch screen and to process a signal generated according to the action.

2. Description of the Related Art

Various types of electronic devices or electronic systems are being used recently. An electronic device or an electronic system performs it own function according to operations of various electronic circuits included therein.

A touch screen system is an example of electronic system that is widely used. The touch screen system may include a display device and a touch sensor disposed on the display device. The touch sensor is used to sense whether an object such as a human's hand or a stylus pen makes contact therewith or approaches thereto. That is, the touch sensor that is a portion of an input device may be used to provide a user interface. For example, the touch sensor may include a capacitive sensor having a capacitance component varying in response to a contact or proximity of an object.

The touch screen system may further include a touch processor circuit to process a signal generated in response to sensing of the touch sensor. For example, when the touch sensor includes a capacitive sensor, the touch processor circuit may convert an analog signal, which has a voltage value varying according to a variation in a capacitance component, into a digital value. The digital value may be provided to an operation processing device (e.g., a central processing unit (CPU), an application processor (AP), or the like), which is included in the touch screen system or is separately provided from the touch screen system. The operation processing device may calculate a position where a contact or proximity occurs or duration of time when a contact or proximity occurs, based on the digital value. The operation processing device may perform and process various operations based on the calculation result and may provide a service to a user.

A touch screen system is utilized in various fields. Especially, the touch screen system may be widely applied to mobile devices such as a portable terminal, a smart phone, or the like. When the touch screen system is applied to the mobile device, the touch screen system needs be implemented to occupy a small area and to consume a small amount of power.

SUMMARY

In some example embodiments, a touch processor circuit may include a capacitance-to-voltage converter and an analog-to-digital converter. The capacitance-to-voltage converter may convert an input signal transmitted from a touch sensor into a conversion signal corresponding to a capacitance of the touch sensor. The analog-to-digital converter may digitize the conversion signal transmitted from the capacitance-to-voltage converter, and may generate a digital value. The analog-to-digital converter may include a first converter, a second converter, and a combination logic circuit. The first converter may calculate upper bits of the digital value based on the conversion signal during a first time period. The second converter may calculate lower bits including bits except for the upper bits in the digital value based on a residue component signal transmitted from the first converter during a second time period that does not overlap with the first time period. The combination logic circuit may combine the upper bits and the lower bits, and may generate the digital value.

In some example embodiments, a touch screen system may include a touch sensor, a capacitance-to-voltage converter, and an analog-to-digital converter. The touch sensor may include a sensing array that has a capacitance component. The capacitance-to-voltage converter may convert an input signal transmitted from the touch sensor into a conversion signal corresponding to a capacitance value of the capacitance component. The analog-to-digital converter may calculate upper bits of a digital value corresponding to the conversion signal through a first analog-to-digital conversion operation during a first time period, calculate lower bits of the digital value through a second analog-to-digital conversion operation that is separate from the first analog-to-digital conversion operation during a second time period that does not overlap the first time period, and combine the upper bits and the lower bits to generate the digital value. The analog-to-digital converter may receive the conversion signal during the first time period, and may not receive the conversion signal during the second time period.

In some example embodiments, an analog-to-digital converter may generate a digital value of a conversion signal that converts an input signal to a device. The analog-to-digital converter may include a first converter, a second converter, and a combination logic circuit. The first converter may calculate upper bits of the digital value based on the conversion signal during a first time period. The second converter may calculate lower bits of the digital value based on a residue component signal during a second time period, the residue component signal being transmitted from the first converter, the second time period not overlapping with the first time period. The combination logic circuit may combine the upper bits and the lower bits such that the digital value is generated.

BRIEF DESCRIPTION OF THE DRAWINGS

Features will become apparent to those of skill in the art by describing in detail exemplary embodiments with reference to the attached drawings in which:

FIG. 9 illustrates a timing diagram describing an operation performed in an analog input path of FIG. 8;

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

All the above-mentioned features and the following descriptions are an exemplary description to help better understanding of the present disclosure. That is, the present disclosure should not be construed as limited to the "example" embodiments set forth herein, and may be embodied in different forms. The following embodiments are merely examples. Therefore, if there are many manners for implementing the components of the present disclosure, it is obvious that the present disclosure is implemented with anything of the manners or anything of the same things thereof.

If it is mentioned that any configuration includes/comprises specific component(s) or any process includes/comprises specific operation(s) in the present disclosure, this means that other component(s) or other step(s) may be further included. That is, the terms used herein are only intended to describe the specific example embodiments, and is not intended to limit the scope of the present disclosure. Further, the examples described to help better understanding of the present disclosure include their complementary embodiments.

The terms used herein have the meaning in which those skilled in the art understand in general. The terms commonly used are to be construed as a consistent meaning in the context of the present disclosure. In addition, the terms used herein should not be interpreted as an overly ideal or formal sense unless expressly so defined herein. Embodiments of the present disclosure will be described below with reference to the attached drawings.

Figure 1:
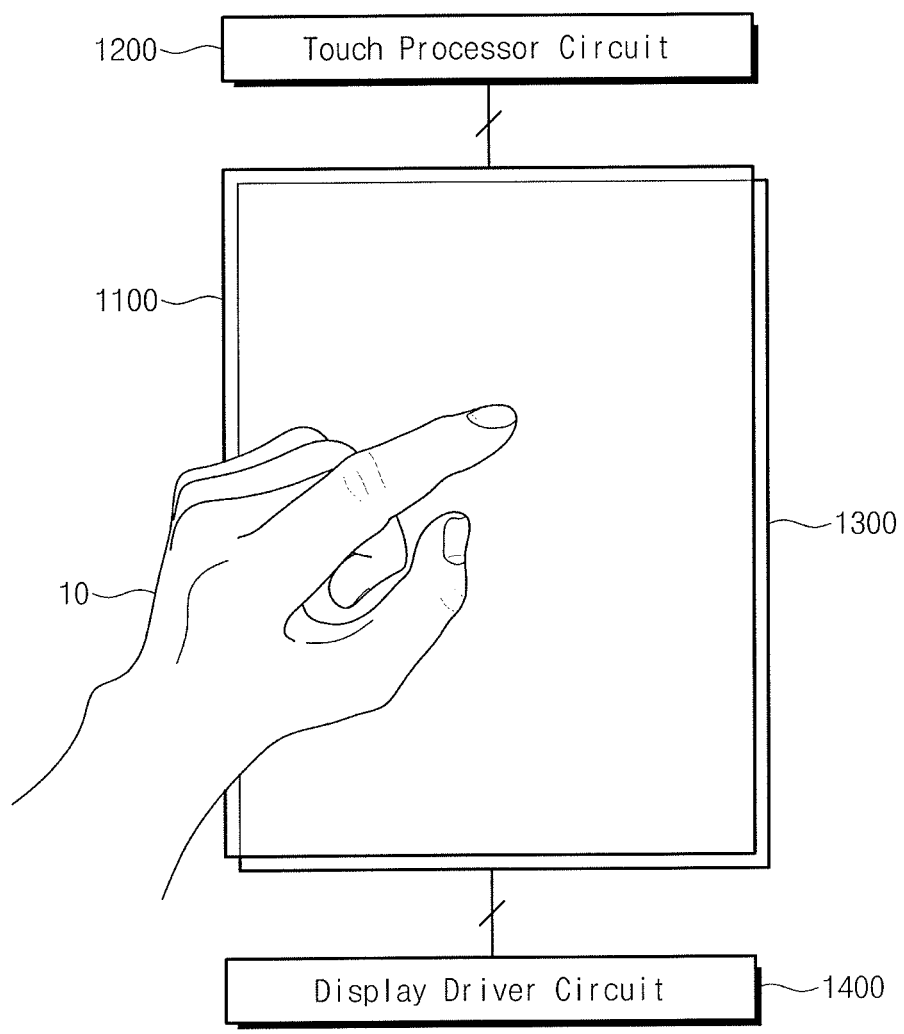
FIGS. 1 and 2 illustrate a conceptual diagram and a block diagram, respectively, each illustrating a touch screen system according to an example embodiment.
Figure 2:
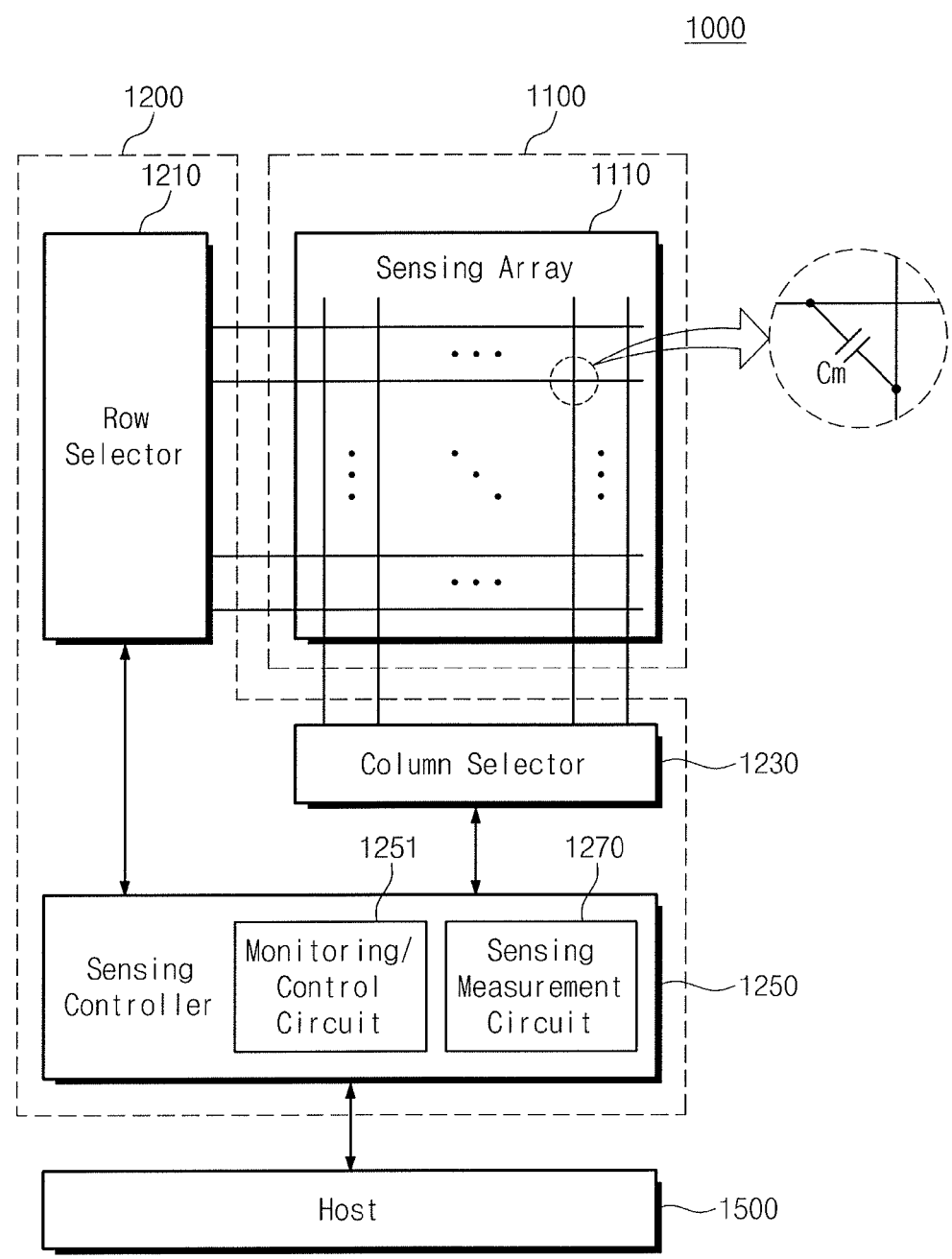

FIGS. 1 and 2 are a conceptual diagram and a block diagram, respectively, each illustrating a touch screen system according to an example embodiment. FIGS. 1 and 2 will be referred together to help better understanding of an example embodiment. A touch screen system 1000 may include a touch sensor 1100, a touch processor circuit 1200, a display device 1300, and a display driver circuit 1400. In some example embodiments, the touch screen system 1000 may further include a host 1500.

Referring to FIG. 1, the touch sensor 1100 may be an input device of an electronic device or an electronic system, and may provide a user interface. The touch sensor 1100 may be used to sense (or detect) a contact or proximity of an object 10 (e.g., a human's hand, a stylus pen, or the like). In an example embodiment, the touch sensor 1100 may include a capacitive sensor having a capacitance component varying in response to the contact or proximity of the object 10.

The touch processor circuit 1200 may be connected to the touch sensor 1100. The touch processor circuit 1200 may process a signal generated in response to sensing of the touch sensor 1100. In an example embodiment, when the touch sensor 1100 includes the capacitive sensor, the touch processor circuit 1200 may receive an analog signal having a voltage value varying according to the change in the capacitance component of the touch sensor 1100. The touch processor circuit 1200 may convert the received analog signal into a digital value.

The digital value may indicate the sensed capacitance value of the capacitance component. The digital value may be provided to a host device (e.g., the host 1500 in FIG. 2), which is included in the touch screen system 1000 or is separately provided from the touch screen system 1000.

The display device 1300 may be an output device of an electronic device or an electronic system, and may provide a user interface. The display device 1300 may provide image information to a user. For example, the display device 1300 may include at least one of a liquid crystal display (LCD), a light emitting diode (LED) display, an organic LED (OLED) display, an active matrix OLED (AMOLED) display, or any combination thereof. The display driver circuit 1400 may drive and control the display device 1300 such that the display device 1300 properly displays the image information.

The touch sensor 1100 may be transparent. Accordingly, light may reach the display device 1300 under the touch sensor 1100, through the touch sensor 1100, thus a user may see the image information displayed on the display device 1300. The user may make contact with or approach the touch sensor 1100 based on the image information displayed on the display device 1300, thus the touch processor circuit 1200 may generate the digital value corresponding to the contact with or proximity to the touch sensor 1100.

The host device (e.g., the host 1500 in FIG. 2) may calculate a position where the contact or proximity occurs and/or duration of time when the contact or proximity occurs, based on the digital value. The host device may perform and process various operations and may provide a service to a user based on the calculation result.

Referring to FIG. 2, the touch sensor 1100 may include a sensing array 1110. The sensing array 1110 may include conductive lines arranged along a row direction or a column direction. The conductive lines arranged along the row direction may be intersected with the conductive lines arranged along the column direction. However, the conductive lines arranged along the row direction may not be connected with the conductive lines arranged along the column direction. The conductive lines may cover an upper surface of the display device 1300 of FIG. 1, and each of intersections of the conductive lines may correspond to a specific coordinate on the display device 1300.

In an example embodiment, when the touch sensor 1100 includes the capacitive sensor, the capacitance component may be formed between each of the conductive lines arranged along the row direction and each of the conductive lines arranged along the column direction. This capacitance component may have a capacitance value Cm. When the object 10 of FIG. 1 makes contact with or approaches the touch sensor 1100, the capacitance value Cm may vary. The contact or proximity of the object 10 may be sensed based on the change in the capacitance value Cm, and the touch processor circuit 1200 may properly process the varying capacitance value Cm.

The touch processor circuit 1200 may include a row selector 1210, a column selector 1230, and a sensing controller 1250. The row selector 1210 may be connected to the conductive lines arranged along the row direction, and the column selector 1230 may be connected to the conductive lines arranged along the column direction. The sensing controller 1250 may control the overall operations of the touch processor circuit 1200 such that the capacitance value Cm is properly processed.

For example, under the control of the sensing controller 1250, the row selector 1210 may provide a signal having a charging-discharging voltage to the conductive lines arranged along the row direction. Under control of the sensing controller 1250, the column selector 1230 may read the capacitance value Cm from the conductive lines arranged along the column direction. The sensing controller 1250 may control selection of one of the conductive lines arranged along the row direction, selection of one of the conductive lines arranged along the column direction, and selection timing. According to this, the capacitance value Cm of each of all intersections of the conductive lines may be obtained.

In some example embodiments, the sensing controller 1250 may include a sensing measurement circuit 1270. The sensing measurement circuit 1270 may digitize the capacitance value Cm, and may generate the digital value corresponding to the capacitance value Cm. Configurations and operations of the sensing measurement circuit 1270 according to some example embodiments will be described with reference to FIGS. 3 to 13. The digital value generated by the sensing measurement circuit 1270 may be provided to the host 1500.

The host 1500 may calculate a position where the contact or proximity occurs and/or duration of time when the contact or proximity occurs, based on the digital value. For example, the host 1500 may include an operation processing device, such as a central processing unit (CPU), an application processor (AP), or the like. The host 1500 may provide a service to a user by means of performing and processing various operations based on the calculation result. To this end, the host 1500 may perform an arithmetic operation and/or a logical operation.

In FIG. 2, the sensing measurement circuit 1270 is illustrated as being included in the sensing controller 1250. However, in some other example embodiments, the sensing measurement circuit 1270 may be provided separately from the sensing controller 1250. Further, in FIG. 2, the host 1500 is illustrated as being included in the touch screen system 1000. However, in some other example embodiments, the host 1500 may be provided separately from the touch screen system 1000. FIGS. 1 and 2 are intended to help better understanding of the example embodiments, not limiting the scope and spirit of the present disclosure.

Figure 3:
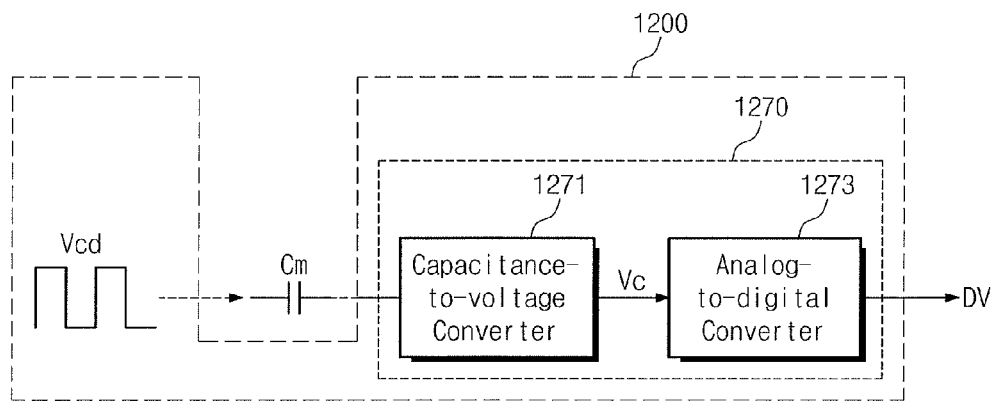
FIG. 3 illustrates a block diagram of a touch processor circuit of FIGS. 1 and 2.

FIG. 3 is a block diagram illustrating a touch processor circuit of FIGS. 1 and 2. As described with reference to FIG. 2, the touch processor circuit 1200 may include the sensing measurement circuit 1270. In some example embodiments, the sensing measurement circuit 1270 may include a capacitance-to-voltage converter 1271 and an analog-to-digital converter 1273. The sensing measurement circuit 1270 may convert a capacitance value Cm of a capacitance component of the sensing array 1110 FIG. 2 into a digital value DV.

Under the control of the sensing controller 1250 of FIG. 2, a signal Vcd having a charging-discharging voltage (hereinafter referred to as a "charging-discharging signal") may be provided to the capacitance component of the sensing array 1110. For example, the charging-discharging signal Vcd may be provided from a separate voltage generation circuit (not shown). For example, the charging-discharging signal Vcd may be a square wave signal having a specific frequency, but the present disclosure is not limited thereto. The capacitance component of the sensing array 1110 may be charged or discharged in response to the charging-discharging signal Vcd, and the capacitance value Cm may be recognized based on charging and discharging of the capacitance component.

The capacitance-to-voltage converter 1271 may receive an input signal from the touch sensor 1100 of FIG. 2, more particularly, from the capacitance component having the capacitance value Cm through the column selector 1230 of FIG. 2. This input signal may be associated with the capacitance value Cm.

The capacitance-to-voltage converter 1271 may convert the input signal into a conversion signal. The conversion signal may have a voltage value Vc that corresponds to the capacitance value Cm. That is, the capacitance-to-voltage converter 1271 may convert the capacitance value Cm into the voltage value Vc. As the capacitance component is charged or discharged, the voltage value Vc of the conversion signal may swing. Moreover, when the capacitance value Cm varies in response to a contact or proximity of an object, the voltage value Vc of the conversion signal may be changed according to the change in the capacitance value Cm.

The capacitance-to-voltage converter 1271 may be implemented using an active element such as an operational amplifier and/or a passive element such as a resistor, a capacitor, or the like. A configuration of the capacitance-to-voltage converter 1271 may be variously modified or changed depending on an embodiment.

The analog-to-digital converter 1273 may receive the conversion signal having the voltage value Vc from the capacitance-to-voltage converter 1271. The analog-to-digital converter 1273 may digitize the conversion signal to generate the digital value DV. The digital value DV may indicate the sensed capacitance value Cm. The digital value DV may be provided to a host device (e.g., the host 1500 in FIG. 2), and the host device may process the digital value DV to provide a service to a user.

In some cases, because the capacitance value Cm is small, amplitude of an output voltage of the capacitance-to-voltage converter 1271 may be small. Accordingly, in some example embodiments associated with the touch processor circuit 1200, an output of the capacitance-to-voltage converter 1271 may be provided to an analog accumulator, and a voltage accumulated by the analog accumulator may be provided to the analog-to-digital converter 1273. Accordingly, the analog-to-digital converter 1273 may receive a signal having a voltage of large amplitude.

However, according to some example embodiments that will be described below, the touch processor circuit 1200 may directly digitize an output of the capacitance-to-voltage converter 1271 by the analog-to-digital converter 1273 without an analog accumulator. That is, in some example embodiments, the touch processor circuit 1200 may exclude an analog accumulator.

An analog accumulator may be provided for each channel corresponding to one capacitance component. Accordingly, when analog accumulators are excluded from all channels, a total area occupied by the touch processor circuit 1200 may be significantly reduced, and an amount of power consumed by the touch processor circuit 1200 may be markedly reduced. As a result, the touch screen system 1000 employing the touch processor circuit 1200 may be efficiently implemented and may efficiently operate.

However, when an output of the capacitance-to-voltage converter 1271 is directly digitized, the analog-to-digital converter 1273 may have a high resolving power (i.e., resolution) characteristic to achieve a desired accuracy. Further, the analog-to-digital converter 1273 may include a noise filter to sufficiently filter a low-frequency component. This is because amplitude of an output voltage of the capacitance-to-voltage converter 1271 may be small.

When the analog-to-digital converter 1273 has a high resolving power, time taken to perform an analog-to-digital conversion may increase. However, because time allocated to perform the analog-to-digital conversion is limited, speed of the analog-to-digital conversion needs to be sufficiently fast. Accordingly, in some example embodiments, the analog-to-digital converter 1273 may perform analog-to-digital conversion of "two steps", which are separately provided. A configuration of the analog-to-digital converter 1273 that satisfies the above conditions will be described with reference to FIG. 4.

Figure 4:
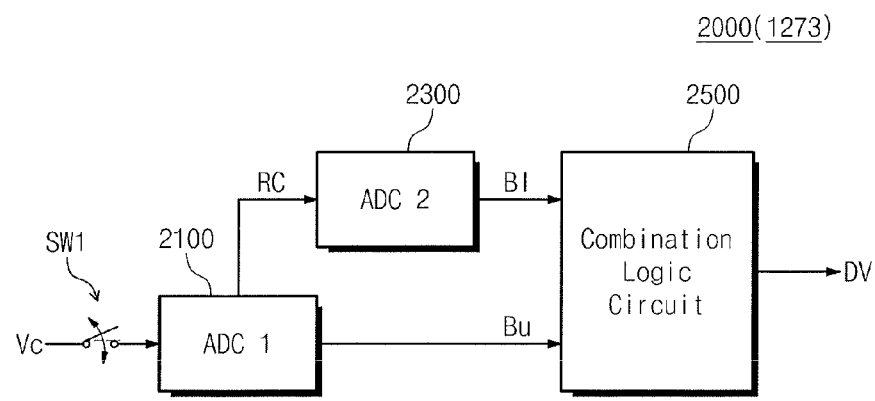
FIG. 4 illustrates a block diagram of an analog-to-digital converter of FIG. 3.

FIG. 4 is a block diagram illustrating an analog-to-digital converter 2000 (1273) of FIG. 3. The analog-to-digital converter 2000 may include a first analog-to-digital converter 2100, a second analog-to-digital converter 2300, and a combination logic circuit 2500. For example, the analog-to-digital converter 1273 of FIG. 3 may include the analog-to-digital converter 2000 of FIG. 4.

The analog-to-digital converter 2000 may digitize a conversion signal having a voltage value Vc to generate a digital value DV. One digital value DV may be generated during one sensing time period. A length of the sensing time period may be variously modified or changed according to a design and implementation. In some example embodiments, the digital value DV may be generated so as to be divided into upper bits Bu and lower bits B1. That is, a bit string of the digital value DV may include the upper bits Bu and the lower bits B1.

The upper bits Bu may be generated during a first time period among one sensing time period and the lower bits B1 may be generated during a second time period among the one sensing time period. The first time period may not overlap with second time period.

The first analog-to-digital converter 2100 may receive the conversion signal having the voltage value Vc from the capacitance-to-voltage converter 1271 of FIG. 3. The first analog-to-digital converter 2100 may perform a first analog-to-digital conversion operation during the first time period. More particularly, the first analog-to-digital converter 2100 may calculate the upper bits Bu of the digital value DV based on the conversion signal during the first time period.

In some example embodiments, the first analog-to-digital converter 2100 may generate a residue component while the upper bits Bu are being calculated.

The second analog-to-digital converter 2300 may receive a residue component signal RC corresponding to the residue component generated by the first analog-to-digital converter 2100. The second analog-to-digital converter 2300 may perform a second analog-to-digital conversion operation, which is separate from the first analog-to-digital conversion operation, during the second time period. More particularly, the second analog-to-digital converter 2300 may calculate the lower bits B1 of the digital value DV based on the residue component signal RC during the second time period. The lower bits B1 may include bits except for the upper bits Bu in the digital value DV.

In some example embodiments, the upper bits Bu and the lower bits B1 may be sequentially generated. That is, after the first analog-to-digital converter 2100 generates the upper bits Bu, the second analog-to-digital converter 2300 may generate the lower bits B1.

The combination logic circuit 2500 may receive the upper bits Bu generated by the first analog-to-digital converter 2100. The combination logic circuit 2500 may receive the lower bits B1 generated by the second analog-to-digital converter 2300. The combination logic circuit 2500 may perform an arithmetic operation and/or a logical operation on the upper bits Bu and the lower bits B1. Accordingly, the combination logic circuit 2500 may combine the upper bits Bu and the lower bits B1 to generate the digital value DV.

The number of the upper bits Bu may be determined at least according to conversion capability of the first analog-to-digital converter 2100. For example, when the first analog-to-digital converter 2100 is capable of performing 6-bit analog-to-digital conversion, the upper bits Bu may include 6 bits. Further, the number of the lower bits B1 may be determined at least according to conversion capability of the second analog-to-digital converter 2300. For example, when the second analog-to-digital converter 2300 is capable of performing 10-bit analog-to-digital conversion, the lower bits B1 may include 10 bits. According to the above examples, the digital value DV may include a bit string of a maximum of 16 bits.

As described above, the analog-to-digital converter 2000 may perform analog-to-digital conversion at a high speed as well as have a high resolving power. Accordingly, the first analog-to-digital converter 2100 generating the upper bits Bu may employ an analog-to-digital conversion scheme for a relatively high accuracy, and the second analog-to-digital converter 2300 generating the lower bits B1 may employ an analog-to-digital conversion scheme for a relatively high speed.

In an example embodiment, the first analog-to-digital converter 2100 may include a sigma-delta analog-to-digital conversion circuit. Because a sigma-delta conversion scheme has relatively high accuracy, the sigma-delta conversion scheme may be employed to generate the upper bits Bu based on the voltage value Vc having a small amplitude.

In an example embodiment, the second analog-to-digital converter 2300 may include a cyclic analog-to-digital conversion circuit. Because a cyclic conversion scheme operates at relatively high speed, the cyclic conversion scheme may be employed to generate the lower bits B1 within a short time. According to the above example embodiments, the digital value DV may be generated with high accuracy and at high speed.

However, the scope and spirit of the present disclosure is not limited to the above-described example embodiments. In some other embodiments, the first analog-to-digital converter 2100 may employ a delta conversion scheme, or the second analog-to-digital converter 2300 may employ a successive approximation scheme. A configuration of the analog-to-digital converter 2000 may be variously modified or changed to perform analog-to-digital conversion of "two steps". However, to help better understanding of the example embodiment, it will be assumed below that the first analog-to-digital converter 2100 employs a sigma-delta scheme and the second analog-to-digital converter 2300 employs a cyclic conversion scheme.

As described above, the upper bits Bu may be calculated during the first time period. To this end, the conversion signal having the voltage value Vc may be transmitted to the first analog-to-digital converter 2100 during the first time interval. On the other hand, the conversion signal may not be transmitted to the first analog-to-digital converter 2100 during the second time period for generating the lower bits B1.

In an example embodiment, the analog-to-digital converter 2000 may include a switch SW1. The switch SW1 may control a connection between the capacitance-to-voltage converter 1271 of FIG. 3 and the analog-to-digital converter 2000. For example, the switch SW1 may connect the capacitance-to-voltage converter 1271 to the analog-to-digital converter 2000 during the first time period. Accordingly, the first analog-to-digital converter 2100 of the analog-to-digital converter 2000 may receive the conversion signal during the first time period.

On the other hand, the switch SW1 may disconnect the capacitance-to-voltage converter 1271 from the analog-to-digital converter 2000 during the second time period. Accordingly, the first analog-to-digital converter 2100 of the analog-to-digital converter 2000 may not receive the conversion signal during the second time period. The operations of the analog-to-digital converter 2000 will be described with reference to FIGS. 5 and 6 in more detail.

In FIG. 4, the switch SW1 is illustrated as being a single switching element. However, a configuration of the switch SW1 may be variously modified or changed. For example, the switch SW1 may be implemented with any switching circuit capable of performing a switching operation, such as a transistor, a buffer circuit, a gate circuit, or the like.

Figure 5:
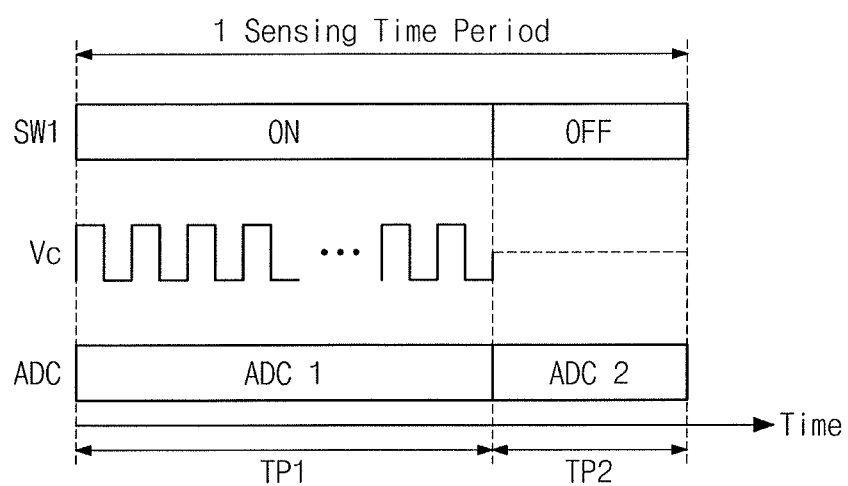
FIG. 5 illustrates a timing diagram describing an operation of an analog-to-digital converter of FIG. 4.
Figure 6:
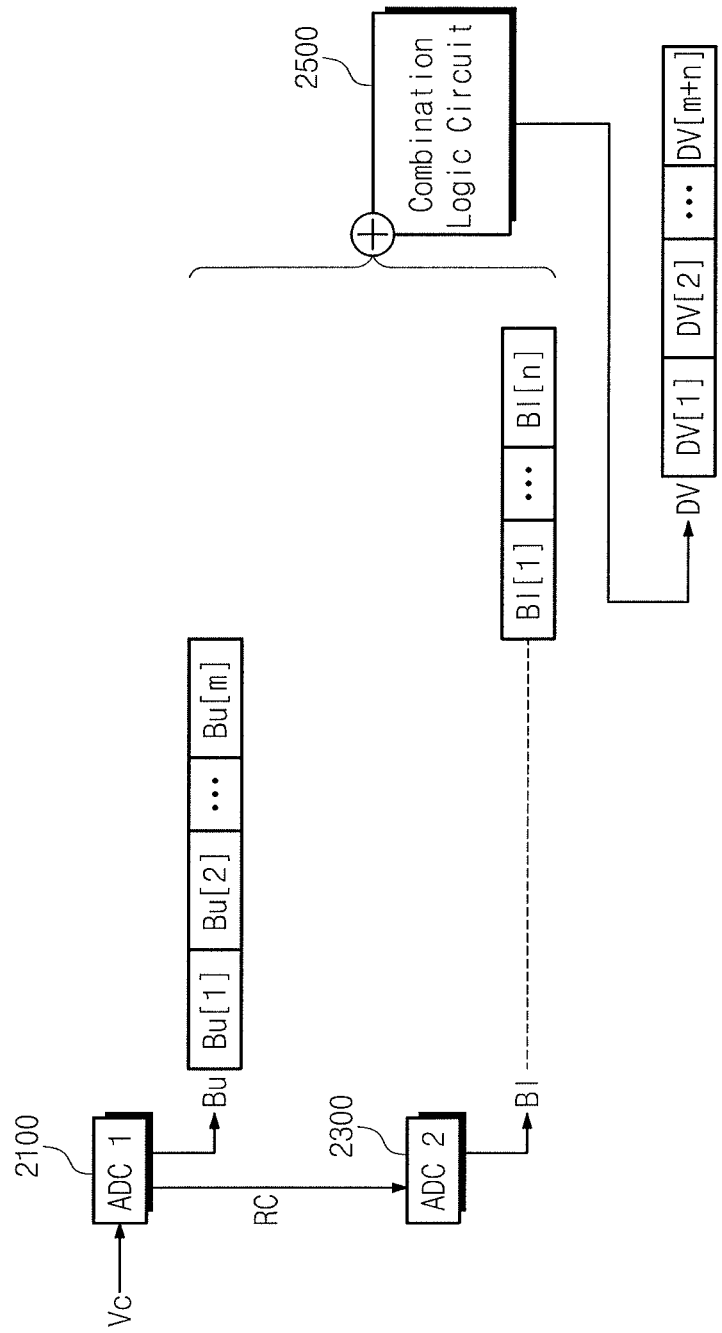
FIG. 6 illustrates a conceptual diagram describing a process of generating a digital value by an analog-to-digital converter of FIG. 4.

FIG. 5 is a timing diagram describing an operation of an analog-to-digital converter of FIG. 4. FIG. 6 is a conceptual diagram describing a process of generating a digital value by an analog-to-digital converter of FIG. 4. FIG. 4 will be referred together with FIGS. 5 and 6 to help better understanding of an example embodiment.

Operations performed in the analog-to-digital converter 2000 of FIG. 4 during one sensing time period are described in FIG. 5. One sensing time period may be a time period for generating one digital value DV. One sensing time period may include a first time period TP1 and a second time period TP2. The first time period TP1 may not overlap the second time period TP2.

During the first time period TP1, the switch SW1 of FIG. 4 may connect the capacitance-to-voltage converter 1271 of FIG. 3 to the analog-to-digital converter 2000 of FIG. 4. Accordingly, a conversion signal having a swinging voltage value Vc may be provided to the analog-to-digital converter 2000. The first analog-to-digital converter 2100 may receive the conversion signal. During the first time period TP1, the first analog-to-digital converter 2100 may perform first analog-to-digital conversion.

Referring to FIG. 6, during the first time period TP1, the first analog-to-digital converter 2100 may calculate upper bits Bu of the digital value DV based on the conversion signal having the voltage value Vc. The first analog-to-digital converter 2100 may generate a residue component during an operation of calculating the upper bits Bu. For example, the upper bits Bu may include m bits. The upper bits Bu may be provided to the combination logic circuit 2500.

For example, the first analog-to-digital converter 2100 may perform an "over-sampling" to calculate the upper bits Bu. That is, the first analog-to-digital converter 2100 may perform the sampling operation several times to generate one digital value DV during one sensing time period. To this end, in some example embodiments, the first analog-to-digital converter 2100 may operate in response to a clock signal having the same frequency as the conversion signal (i.e., a frequency of an input signal transmitted to the capacitance-to-voltage converter 1271).

For example, a clock signal generator may be provided to transmit the clock signal to the first analog-to-digital converter 2100. The clock signal generator may include various circuits such as, for example, an oscillator circuit, a phase locked loop (PLL) circuit, and/or the like, to provide the clock signal having a stable frequency to the first analog-to-digital converter 2100. The clock signal generator may be provided inside or outside the sensing measurement circuit 1270.

In some example embodiments, the first analog-to-digital converter 2100 may perform a "double-sampling". That is, the first analog-to-digital converter 2100 may perform a sampling operation at both a rising edge and a falling edge of the conversion signal having the voltage value Vc. The over-sampling and double-sampling may make the accuracy of the first analog-to-digital converter 2100 increased.

Referring to FIG. 5, during the second time period TP2, the switch SW1 of FIG. 4 may disconnect the capacitance-to-voltage converter 1271 of FIG. 3 from the analog-to-digital converter 2000. Accordingly, the first analog-to-digital converter 2100 may not receive the conversion signal during the second time period TP2. The switch SW1 may be opened according to the control of the sensing controller 1250 of FIG. 2. Further, the second analog-to-digital converter 2300 may start to operate according to the control of the sensing controller 1250 of FIG. 2. During the second time period TP2, the second analog-to-digital converter 2300 may perform the second analog-to-digital conversion operation. The second analog-to-digital conversion operation may be separate from the first analog-to-digital conversion operation.

To control the operation of the switch SW1, the sensing controller 1250 may monitor the operations of the first analog-to-digital converter 2100 and/or the second analog-to-digital converter 2300. For example, the sensing controller 1250 may further include a monitoring/control circuit 1251 to monitor the operations of the first analog-to-digital converter 2100 and/or the second analog-to-digital converter 2300. The monitoring/control circuit 1251 may monitor whether the first analog-to-digital converter 2100 and/or the second analog-to-digital converter 2300 output the calculation result(s). For example, the monitoring/control circuit 1251 may disconnect the switch SW1 in response to the calculation result of the first analog-to-digital converter 2100, and may connect the switch SW1 in response to the calculation result of the second analog-to-digital converter 2300.

Referring to FIG. 6, the second analog-to-digital converter 2300 may receive a residue component signal RC corresponding to the residue component generated by the first analog-to-digital converter 2100. During the second time period TP2, the second analog-to-digital converter 2300 may calculate the lower bits B1 of the digital value DV based on the residue component signal RC. For example, the lower bits B1 may include n bits. The lower bits B1 may be provided to the combination logic circuit 2500.

The second analog-to-digital converter 2300 may operate at faster speed than the first analog-to-digital converter 2100. In some example embodiments, the second analog-to-digital converter 2300 may operate in response to a clock signal having a frequency higher than a frequency used to operate the first analog-to-digital converter 2100. To this end, the second analog-to-digital converter 2300 may receive a clock signal that is independently provided from a clock signal for the first analog-to-digital converter 2100.

For example, a clock signal generator may be provided to transmit the clock signal to the second analog-to-digital converter 2300. The clock signal generator may include various circuits such as, for example, an oscillator circuit, a PLL circuit, and/or the like, to provide the clock signal having a stable frequency to the second analog-to-digital converter 2300. The clock signal generator may be provided inside or outside the sensing measurement circuit 1270. The clock signal generator for the second analog-to-digital circuit 2300 may be implemented together with or separately from the clock signal generator for the first analog-to-digital circuit 2100. For example, when the clock signal generator for the second analog-to-digital circuit 2300 may be implemented together with the clock signal generator for the first analog-to-digital circuit 2100, the clock signal generator may include a clock divider to output the clock signals having different frequencies. Alternatively, when the clock signal generator for the second analog-to-digital circuit 2300 may be implemented separately from the clock signal generator for the first analog-to-digital circuit 2100, the PLL circuit of the clock signal generator for the second analog-to-digital circuit 2300 may operate at an operation frequency which is different from that of the PLL circuit of the clock signal generator for the first analog-to-digital circuit 2100.

When a frequency of a clock signal used to operate the second analog-to-digital converter 2300 increases, a length of the second time period TP2 may be shortened. Accordingly, a length of a sensing time period may be shortened, and the analog-to-digital converter 2000 may operate at high speed.

The combination logic circuit 2500 may perform any proper arithmetic operation and/or logical operation on the upper bits Bu and the lower bits B1. The combination logic circuit 2500 may combine the upper bits Bu and the lower bits B1, and may generate the digital value DV. The digital value DV may include a maximum of (m+n) bits.

As illustrated in FIG. 6, when the upper bits Bu are not overlapped with the lower bits B1, the digital value DV may include a bit string of (m+n) bits. On the other hand, in some example embodiments, a portion of the lower bits B1 may be located so as to overlap a portion of the upper bits Bu. In this example embodiment, the digital value DV may include a bit string shorter than (m+n) bits. Such an example embodiment will be described with reference to FIG. 13.

According to a process described with reference to FIGS. 4 to 6, the analog-to-digital converter 2000 may convert the conversion signal having the voltage value Vc into the digital value DV, through the analog-to-digital conversion of "two steps". In the analog-to-digital conversion of two steps, the upper bits Bu of the digital value DV may be calculated separately from the lower bits B1 of the digital value DV.

Figure 7:
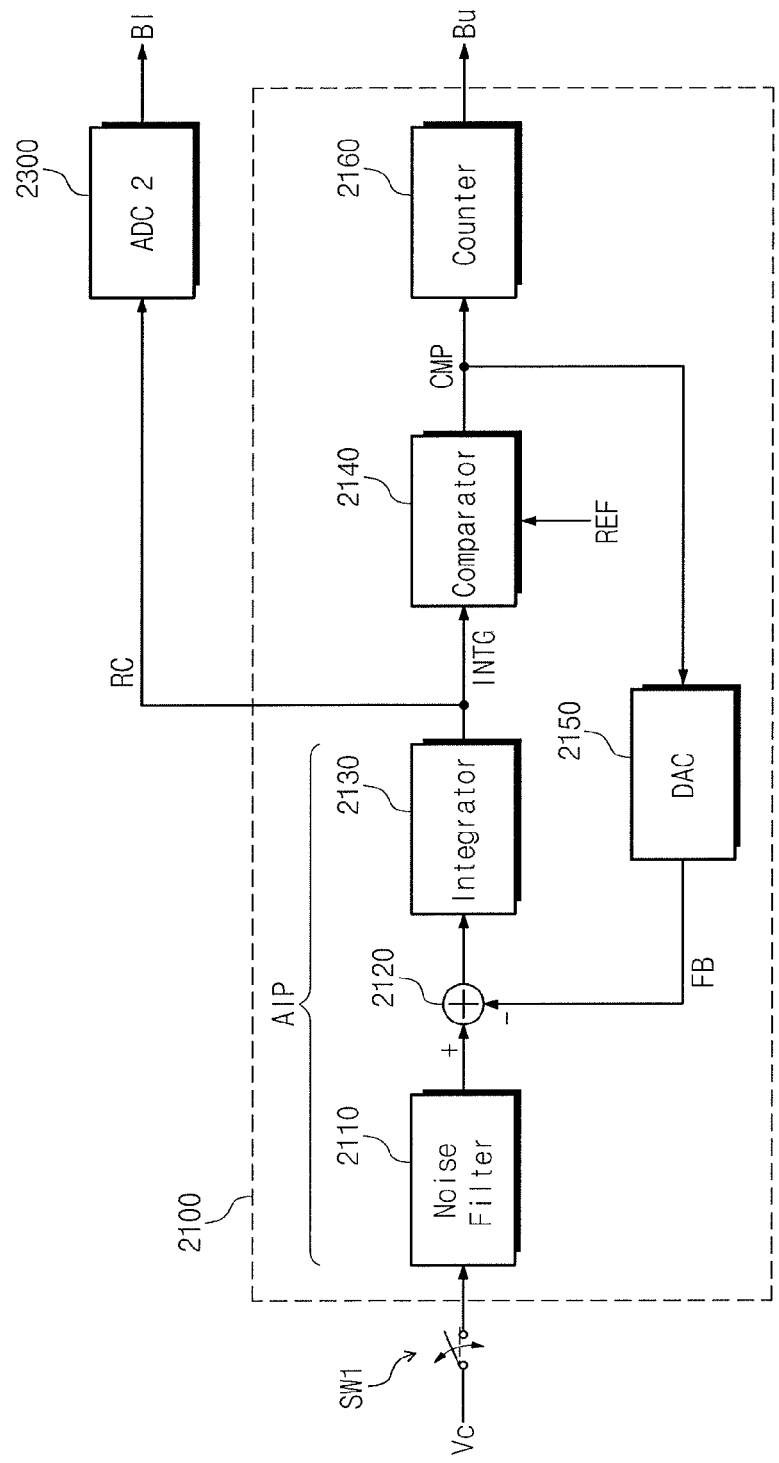
FIG. 7 illustrates a block diagram of a first analog-to-digital converter in an analog-to-digital converter of FIG. 4.

FIG. 7 is a block diagram exemplarily illustrating a first analog-to-digital converter in an analog-to-digital converter of FIG. 4. FIG. 7 illustrates that the first analog-to-digital converter 2100 includes a sigma-delta analog-to-digital conversion circuit.

During a first time period among a sensing time period, the first analog-to-digital converter 2100 may receive a conversion signal having a voltage value Vc through a switch SW1. The first analog-to-digital converter 2100 may calculate upper bits Bu based on the conversion signal. During a second time period among the sensing time period, the switch SW1 may be opened. During the second time period, the second analog-to-digital converter 2300 may calculate lower bits B1 based on a residue component signal RC.

In an example embodiment, the first analog-to-digital converter 2100 may include a noise filter 2110, a subtractor 2120, an integrator 2130, a comparator 2140, a digital-to-analog converter 2150, and a counter 2160. The noise filter 2110 may filter a low-frequency component of the conversion signal having the voltage value Vc. The noise filter 2110 may be used to perform analog-to-digital conversion more precisely. The conversion signal of which the low-frequency component is filtered may be provided to the subtractor 2120.

The subtractor 2120 may receive the filtered conversion signal and a feedback signal FB. The subtractor 2120 may subtract the feedback signal FB from the filtered conversion signal to generate a subtraction signal. The subtraction signal may be provided to the integrator 2130. The integrator 2130 may perform an integration operation on the subtraction signal to generate an integration signal INTG. The integrator 2130 may output the residue component signal RC for the second analog-to-digital converter 2300 corresponding to the residue component that is generated when the first analog-to-digital converter 2100 operates.

An analog input path AIP may include the noise filter 2110, the subtractor 2120, and the integrator 2130. An example embodiment for a configuration of an analog input path AIP will be described with reference to FIG. 8.

The comparator 2140 may receive the integration signal INTG. The comparator 2140 may compare a reference signal REF with the integration signal INTG to generate a comparison signal CMP. For example, the reference signal REF may be provided from a separate voltage generation circuit. The comparison signal CMP may be fed back to the subtractor 2120 to generate the residue component. The digital-to-analog converter 2150 may convert the comparison signal CMP into an analog signal to generate the feedback signal FB. The counter 2160 may generate the upper bits Bu based on the comparison signal CMP.

For example, when amplitude of the integration signal INTG is greater than or equal to amplitude of the reference signal REF, the comparator 2140 may generate the comparison signal CMP having a logical value of "1". On the other hand, when amplitude of the integration signal INTG is smaller than amplitude of the reference signal REF, the comparator 2140 may generate the comparison signal CMP having a logical value of "0". The counter 2160 may count the number of events where the comparison signal CMP having a logical value of "1" is received. The upper bits Bu may be calculated according to an operation of the counter 2160.

A "sigma-delta (ΣΔ)" scheme may be implemented by the subtractor 2120 and the integrator 2130. A circuit operation for such a scheme is well known to those skilled in the art. Accordingly, detailed descriptions associated with the operation of the sigma-delta analog-to-digital conversion circuit will be omitted below.

A configuration of the first analog-to-digital converter 2100 employing the sigma-delta conversion scheme has been described with reference to FIG. 7. However, the configuration of the first analog-to-digital converter 2100 may be variously modified or changed in some other example embodiments. FIG. 7 is provided to help better understanding of the present disclosure, and is not intended to limit the present disclosure.

Figure 8:
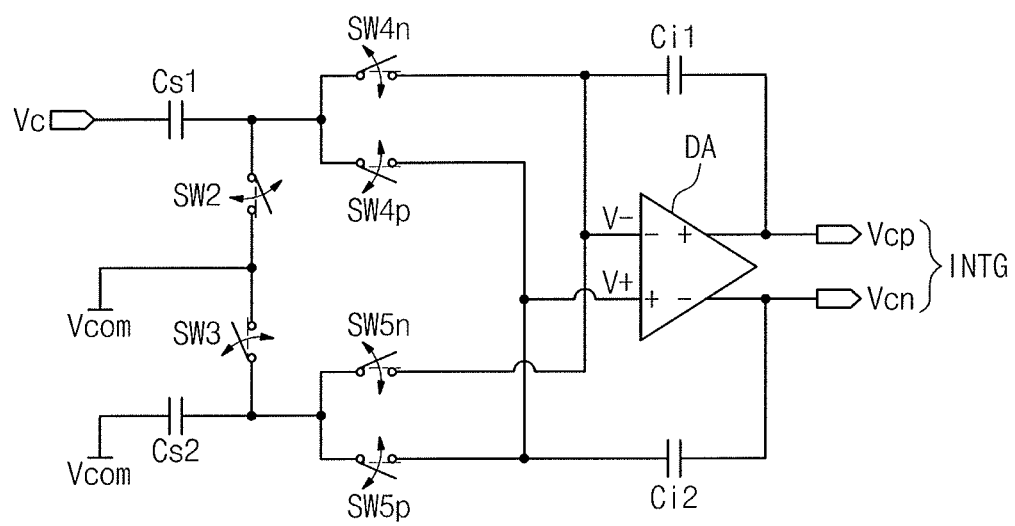
FIG. 8 illustrates a conceptual diagram of an analog input path of FIG. 7.

FIG. 8 is a conceptual diagram exemplarily illustrating an analog input path of FIG. 7. FIG. 9 is a timing diagram describing an operation performed in an analog input path of FIG. 8. FIG. 7 will be referred together with FIGS. 8 and 9 to help better understanding of an example embodiment.

For example, an analog input path AIP may perform functions of the noise filter 2110, the subtractor 2120, and the integrator 2130 illustrated in FIG. 7. A conversion signal having a voltage value Vc may be provided to the analog input path AIP.

Referring to FIG. 8, the conversion signal may be provided to one terminal of a sensing capacitor Cs1. The conversion signal may be a single-ended signal output from the capacitance-to-voltage converter 1271 of FIG. 3.

In an example embodiment, a differential signal system may be employed to improve reliability and integrity of a signal. To generate the differential signal, an additional sensing capacitor Cs2 may be provided, and a common mode signal having a common mode voltage Vcom may be applied to a first terminal of the sensing capacitor Cs2. For example, the common mode signal may be provided from a separate voltage generation circuit.

To control stability and operations of the circuit, the common mode signal having the common mode voltage Vcom may or may not be provided to the other terminal of the sensing capacitor Cs1 through a switch SW2. Further, the common mode signal may be provided or not be provided to a second terminal of the sensing capacitor Cs2 through a switch SW3.

The second terminal of the sensing capacitor Cs1 may be connected or not be connected to a non-inverting input terminal of a differential amplifier DA through a switch SW4$p$. The second terminal of the sensing capacitor Cs1 may or may not be connected to an inverting input terminal of the differential amplifier DA through a switch SW4$n$. The second terminal of the sensing capacitor Cs2 may or may not be connected to the non-inverting input terminal of the differential amplifier DA through a switch SW5$p$. The second terminal of the sensing capacitor Cs2 may or may not be connected to the inverting input terminal of the differential amplifier DA through a switch SW5$n$.

An integration capacitor Ci1 may be connected between the inverting input terminal and a non-inverting output terminal of the differential amplifier DA. An integration capacitor Ci2 may be connected between the non-inverting input terminal and an inverting output terminal of the differential amplifier DA. The differential amplifier DA may output a signal having a non-inverting voltage Vcp through the non-inverting output terminal, and may output a signal having an inverting voltage Vcn through the inverting output terminal. The signal having the non-inverting voltage Vcp and the signal having the inverting voltage Vcn may be provided to the comparator 2140 of FIG. 7, as an integration signal INTG that is a differential signal. In this example embodiment, the comparator 2140 may be implemented with a differential comparator.

Referring to FIGS. 8 and 9 together to describe an operation performed in the analog input path AIP, in a time interval between time 't0' and time 't1', the switch SW4$n$ and the switch SW5$p$ may be connected, and the switch SW4$p$ and the switch SW5$n$ may be disconnected. Accordingly, the inverting input terminal of the differential amplifier DA may be connected to the second terminal of the sensing capacitor Cs1, and the non-inverting input terminal of the differential amplifier DA may be connected to the second terminal of the sensing capacitor Cs2.

In a time interval between time 't1' and time 't2', the switch SW4$p$ and the switch SW5$n$ may be connected, and the switch SW4$n$ and the switch SW5$p$ may be disconnected. Accordingly, the inverting input terminal of the differential amplifier DA may be connected to the second terminal of the sensing capacitor Cs2, and the non-inverting input terminal of the differential amplifier DA may be connected to the second terminal of the sensing capacitor Cs1.

In a time interval between time 't2' and time 't3', operations that are the same as those performed in the time interval between time 't0' and time 't1' may be performed. In a time interval between time 't3' and time 't4', operations that are the same as those performed in the time interval between time 't1' and time 't2' may be performed.

According to the above operations, each of the inverting input terminal and the non-inverting input terminal of the differential amplifier DA may alternately receive a conversion signal having the voltage value Vc and the common mode signal having the common mode voltage Vcom. Accordingly, the integration signal INTG that is a differential signal may be properly generated. For example, each of signal input terminals of the differential amplifier DA may receive the conversion signal and the common mode signal in turn, in response to the same frequency as that of the conversion signal (i.e., a frequency of an input signal transmitted to the capacitance-to-voltage converter 1271).

Functions performed in the analog input path AIP will be further described. To help better understanding, a transfer characteristic will be denoted by a letter 'z'. It will be assumed that time 't3' of FIG. 9 is a present time point. Further, it will be assumed that sensing capacitors Cs1 and Cs2 have the same capacitance value "Cs".

According to the above assumptions, in time 't3', the quantity of charge "Q−" in the inverting input terminal of the differential amplifier DA and the quantity of charge "Q+" in the non-inverting input terminal of the differential amplifier DA may be described by the following Equations 1 and 2, respectively.

$$Q-|_{t3}=Vc(1-z^{-1})Cs \qquad \text{[Equation 1]}$$

$$Q+|_{t3}=V\mathrm{com}(1-z^{-1})Cs \qquad \text{[Equation 2]}$$

Accordingly, in time 't3', the quantity of charge in the signal input terminals of the differential amplifier DA may be described by the following Equation 3.

$$Q+-Q-|_{t3}=-(Vc-V\mathrm{com})(1-z^{-1})Cs \qquad \text{[Equation 3]}$$

Meanwhile, in time 't2' before one sampling, the quantity of charge "Q−" in the inverting input terminal and the quantity of charge "Q+" in the non-inverting input terminal may be described by the following Equations 4 and 5, respectively.

$$Q-|_{t2}=-Vc(z^{-1}-z^{-2})Cs \qquad \text{[Equation 4]}$$

$$Q+|_{t2}=-V\mathrm{com}(z^{-1}-z^{-2})Cs \qquad \text{[Equation 5]}$$

Accordingly, in time 't2', the quantity of charge in the signal input terminals of the differential amplifier DA may be described by the following Equation 6.

$$Q+-Q-|_{t2}=(Vc-Vcom)(z^{-1}-z^{-2})Cs \quad \text{[Equation 6]}$$

Referring to the Equations 3 and 6, the total quantity of charge "Qtot" generated from time 't2' to time 't3' may be described by the following Equation 7.

$$\begin{aligned} Qtot & \quad \text{[Equation 7]} \\ &= (Q+-Q-|_{t2}) + (Q+-Q-|_{t3}) \\ &= -(Vc-Vcom)(1-2z^{-1}+z^{-2})Cs \end{aligned}$$

Referring to the term "$1-2z^{-1}+z^{-2}$" in the Equation 7, it may be understood that the analog input path AIP has a second-order correlated double sampling (CDS) characteristic. Accordingly, a function of the noise filter 2110 of FIG. 7 may be performed in the analog input path AIP. Further, a function of the subtractor 2120 of FIG. 7 may be performed through the signal input terminals of the differential amplifier DA. Moreover, a function of the integrator 2130 of FIG. 7 may be performed by the differential amplifier DA and the integration capacitors Ci1 and Ci2.

The configuration illustrated in FIG. 8 and the operations described in FIG. 9 are just provided to help better understanding of the present disclosure, but are not intended to limit the present disclosure. In some other example embodiments, other configurations and other operations may be implemented. For example, a single-ended signal system may be adopted instead of a differential signal system. Embodiments of the present disclosure may be variously modified or changed.

Figure 10:
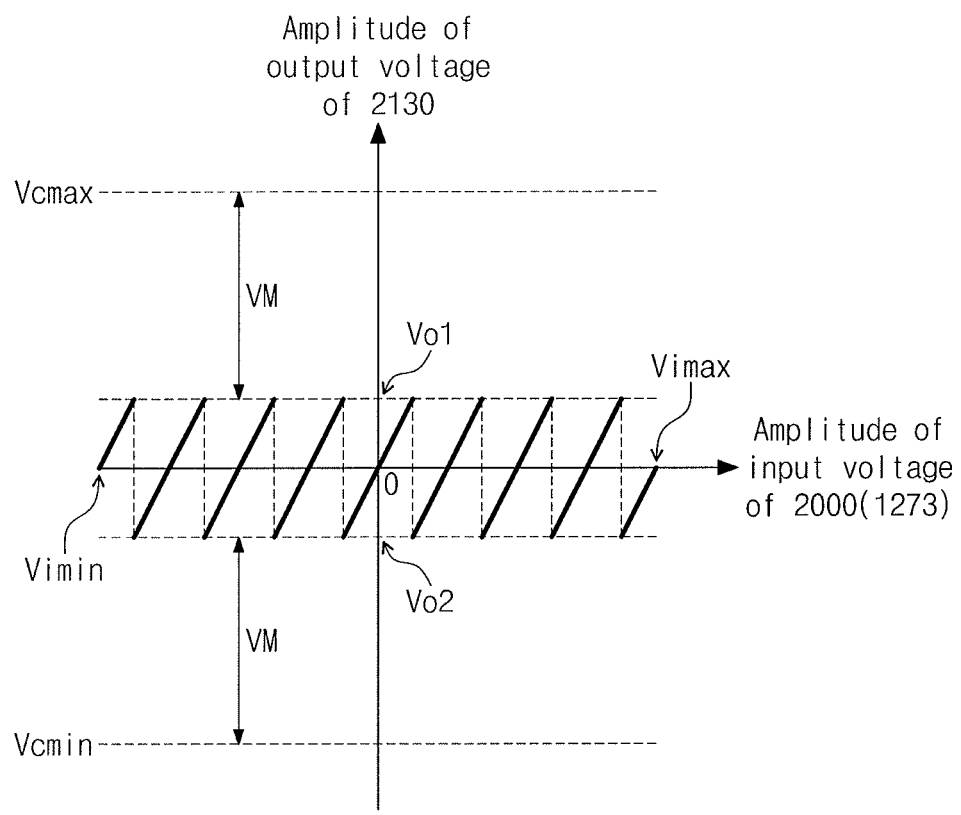
FIG. 10 illustrates a graph showing a relation between an input of an analog-to-digital converter of FIG. 4 and an output of an integrator of FIG. 7.

FIG. 10 is a graph showing a relation between an input of an analog-to-digital converter of FIG. 4 and an output of an integrator of FIG. 7.

In the graph shown in FIG. 10, the horizontal axis designates the amplitude of an input voltage of the analog-to-digital converter 2000 (i.e., a voltage value Vc of a conversion signal). As described above, the voltage value Vc of the conversion signal may swing between a maximum input voltage value Vimax and a minimum input voltage value Vimin.

In the graph shown in FIG. 10, the vertical axis designates the amplitude of an output voltage of the integrator 2130. The integrator 2130 may output a signal having a voltage value included in a voltage interval defined by voltage values Vo1 and Vo2, based on the conversion signal having the swinging voltage value Vc. As described above, a residue component signal RC output from the integrator 2130 may be provided to the second analog-to-digital converter 2300 of FIG. 4.

In some example embodiments, the analog input path AIP of FIG. 8 may have a small gain characteristic. For example, the analog input path AIP may be implemented to have a small gain in consideration of an aspect of a system design such as influence of noise, efficiency of signal processing, power consumption, or the like.

In some example embodiments, the second analog-to-digital converter 2300 may be designed to digitize a signal having a voltage value between a maximum conversion voltage value Vcmax and a minimum conversion voltage value Vcmin. However, when the analog input path AIP has a small gain characteristic, a "voltage margin" VM may occur between a voltage interval including the voltage value of an output voltage of the integrator 2130 (i.e., the voltage interval defined by voltage values Vo1 and Vo2) and the maximum conversion voltage value Vcmax (or the minimum conversion voltage value Vcmin).

When the voltage margin VM occurs, the second analog-to-digital converter 2300 may not perform an analog-to-digital conversion operation corresponding to the voltage margin VM. In this case, an error may occur in lower bits B1 calculated by the second analog-to-digital converter 2300.

To prevent the error from occurring, in an example embodiment, a controller may be implemented to control an output voltage of the integrator 2130. Such an example embodiment will be described with reference to FIGS. 11 and 12. In another example embodiment, an "additional bit" to compensate for the error may be generated. Such an example embodiment will be described with reference to FIG. 13.

Figure 11:
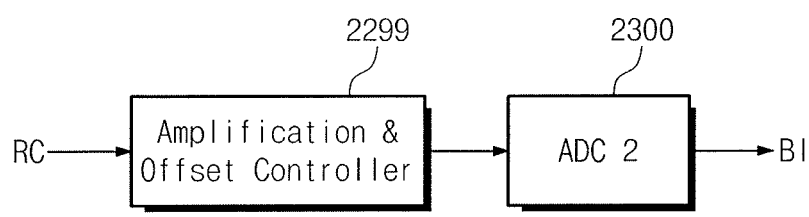
FIG. 11 illustrates a block diagram of a connection of an amplification and offset controller for adjusting an output of an integrator of FIG. 7.
Figure 12:
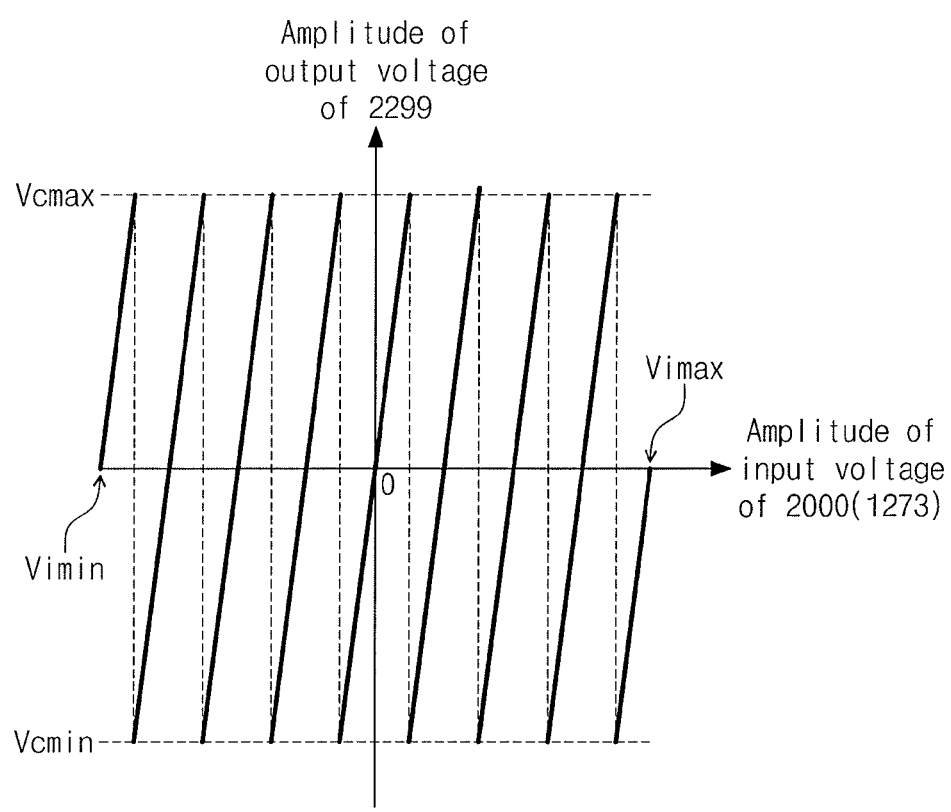
FIG. 12 illustrates a graph showing a relation between an input of an analog-to-digital converter of FIG. 4 and an output of an amplification and offset controller of FIG. 11.

FIG. 11 is a block diagram illustrating a connection of an amplification and offset controller for adjusting an output of an integrator of FIG. 7. FIG. 12 is a graph showing a relation between an input of an analog-to-digital converter of FIG. 4 and an output of an amplification and offset controller of FIG. 11.

Referring to FIG. 11, the analog-to-digital converter 2000 may include an amplification and offset controller 2299. The amplification and offset controller 2299 may be connected between the integrator 2130 and the second analog-to-digital converter 2300. The amplification and offset controller 2299 may receive a residue component signal RC from the integrator 2130.

The amplification and offset controller 2299 may adjust amplitude of the residue component signal RC. For example, referring to FIG. 12, the amplification and offset controller 2299 may adjust the amplitude of the residue component signal RC such that the residue component signal RC output from the integrator 2130 has a voltage value between a maximum conversion voltage value Vcmax and a minimum conversion voltage value Vcmin. The amplification and offset controller 2299 may provide the residue component signal RC having the adjusted amplitude to the second analog-to-digital converter 2300.

As illustrated in FIG. 12, when the amplitude of the residue component signal RC is adjusted, a voltage margin VM shown in FIG. 10 may not occur. Accordingly, no error may occur in lower bits B1 calculated by the second analog-to-digital converter 2300.

However, in some cases, when an offset exists in an output of the integrator 2130 or an offset occurs in an input of the second analog-to-digital converter 2300, a portion of the residue component signal RC may have a voltage value larger than the maximum conversion voltage value Vcmax or smaller than the minimum conversion voltage value Vcmin. In this case, an error may be caused due to a signal that has a voltage value being out of a voltage interval defined by the maximum conversion voltage value Vcmax and the minimum conversion voltage value Vcmin To prevent an error, the amplification and offset controller 2299 may adjust an offset of the residue component signal RC. The amplification and offset controller 2299 may compensate for an offset of an output of the integrator 2130 or an offset of an input of the second analog-to-digital converter 2300, thereby preventing an error from occurring. The second analog-to-digital converter 2300 may perform analog-to-digital conversion based on the residue component signal RC adjusted by the amplification and offset controller 2299.

Figure 13:
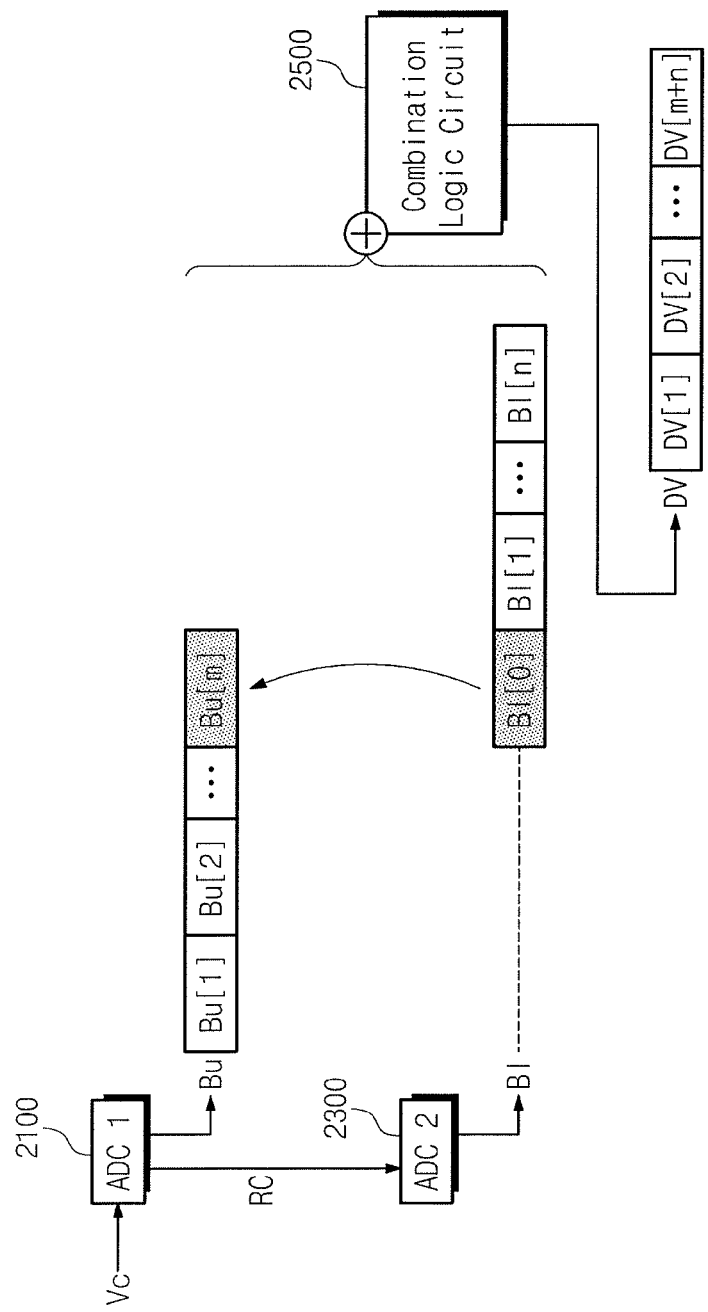
FIG. 13 illustrates a conceptual diagram describing a process of generating a digital value by means of an additional bit generated from a second analog-to-digital converter of FIG. 4.

FIG. 13 is a conceptual diagram describing a process of generating a digital value by means of an additional bit generated from a second analog-to-digital converter of FIG. 4.

As described above, during a first time period of one sensing time period, the first analog-to-digital converter 2100 may calculate upper bits Bu of a digital value DV based on a conversion signal having a voltage value Vc. The first analog-to-digital converter 2100 may generate a residue component when calculating the upper bits Bu. For example, the upper bits Bu may include m bits.

Further, the second analog-to-digital converter 2300 may receive a residue component signal RC corresponding to the residue component generated by the first analog-to-digital converter 2100. During a second time period of one sensing time period, the second analog-to-digital converter 2300 may calculate lower bits Bl of the digital value DV based on the residue component signal RC.

The lower bits Bl according to an example embodiment illustrated in FIG. 13 may include (n+1) bits, compared with the example embodiment described with reference to FIG. 6. In this example embodiment, the lower bits Bl may further include an "additional bit" Bl[0], as well as n bits (i.e., Bl[1] to Bl[n]). To calculate bits more than n bits (i.e., (n+1) bits), the second analog-to-digital converter 2300 may be designed to have high conversion capability.

The additional bit Bl[0] may be calculated to compensate for an error due to a small gain characteristic of the first analog-to-digital converter 2100 (more particularly, an analog input path AIP illustrated in FIG. 8). For example, the additional bit Bl[0] may overlap with a portion of the upper bits Bu (e.g., a least significant bit Bu[m] of the upper bits Bu) in the digital value DV.

As described with reference to FIG. 10, when the analog input path AIP has a small gain characteristic, an error of an analog-to-digital conversion may occur due to a voltage margin VM. This is because the second analog-to-digital converter 2300 may not perform analog-to-digital conversion corresponding to the voltage margin VM. However, when the second analog-to-digital converter 2300 performs analog-to-digital conversion to further generate the additional bit Bl[0], the additional bit Bl[0] may be used to compensate for a value corresponding to the voltage margin VM.

As a result, when the additional bit Bl[0] is employed, an error due to the voltage margin VM may be prevented. Moreover, when the additional bit Bl[0] is employed, the conversion may be acceptable even though the voltage margin VM occurs. Accordingly, an additional component such as the amplification and offset controller 2299 of FIG. 11 may be omitted.

In FIG. 13, an example embodiment has been described such that one additional bit Bl[0] is further generated. However, the number of additional bits may be modified or changed based on various factors, such as an amount of the voltage margin VM, required accuracy, design of a circuit or a device, or the like. In some example embodiments, the lower bits Bl may include two or more additional bits.

The upper bits Bu and the lower bits Bl including the additional bit Bl[0] may be provided to the combination logic circuit 2500. The combination logic circuit 2500 may perform any proper arithmetic operation and/or logical operation on the upper bits Bu and the lower bits Bl including the additional bit Bl[0]. The combination logic circuit 2500 may combine the upper bits Bu and the lower bits Bl including the additional bit Bl[0] to generate the digital value DV.

For example, the combination logic circuit 2500 may combine at least one bit that overlaps the additional bit Bl[0] from among the upper bits Bu[m] with the additional bit Bl[0] by means of a logical OR operation. Accordingly, the digital value DV may be generated including (m+n) bits. (m+n+1) bits may be generated by the first analog-to-digital converter 2100 and the second analog-to-digital converter 2300, but the digital value DV may include (m+n) bits less than (m+n+1) bits. When one or more additional bits are generated, the digital value DV may include bits of which the number is less than those generated by the first analog-to-digital converter 2100 and the second analog-to-digital converter 2300.

Figure 14:
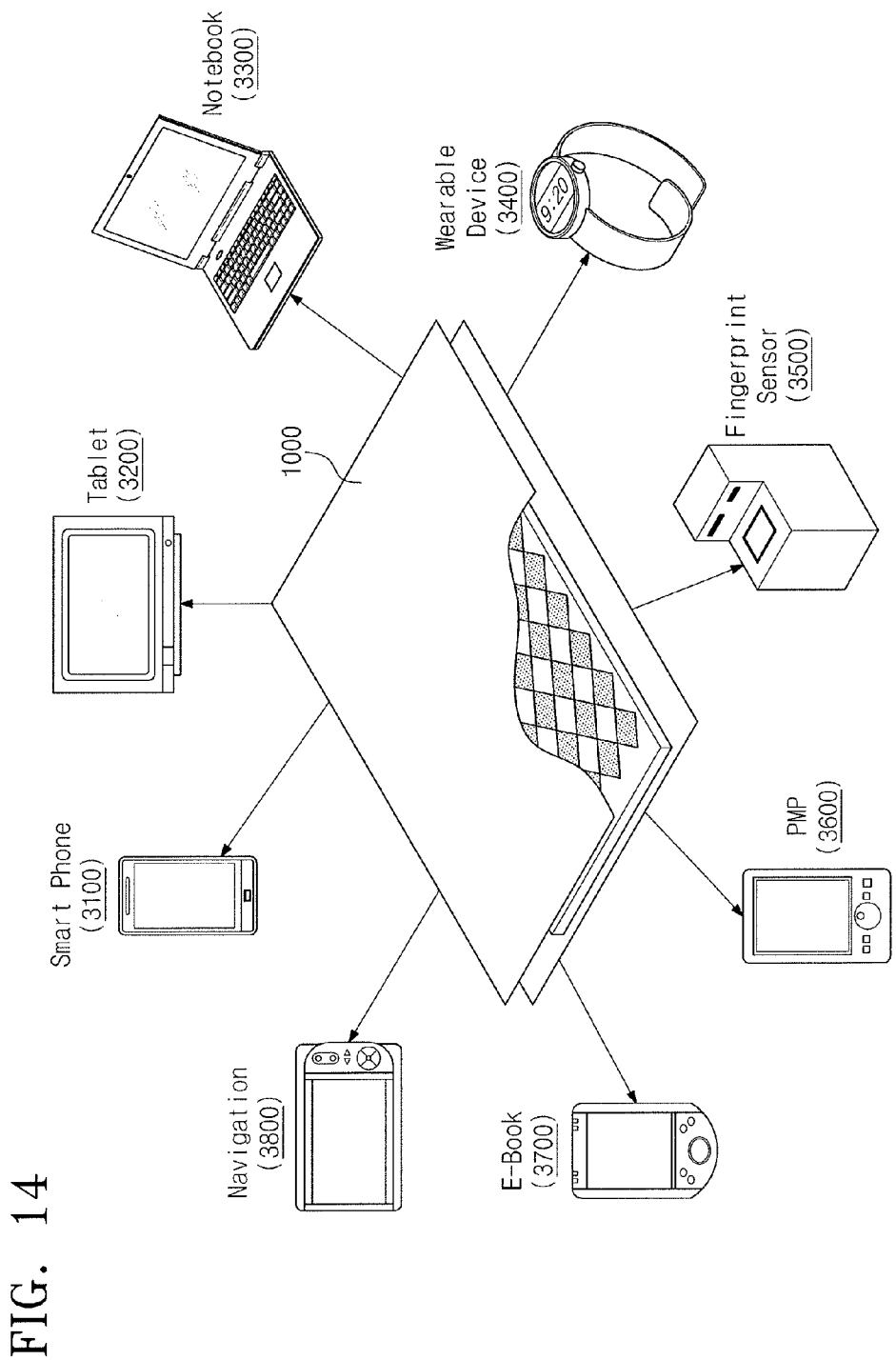
FIG. 14 illustrates a conceptual diagram of various kinds of electronic devices employing a touch processor circuit and a touch screen system according to an example embodiment.

FIG. 14 is a conceptual diagram illustrating various kinds of electronic devices employing a touch processor circuit and a touch screen system according to an example embodiment.

The touch processor circuit 1200 (refer to FIGS. 1 to 3) according to an example embodiment may directly digitize an output of the capacitance-to-voltage converter 1271 without an analog accumulator. Further, the touch processor circuit 1200 may perform analog-to-digital conversion of two steps.

The touch processor circuit 1200 according to an example embodiment and the touch screen system 1000 including the same may be employed by various kinds of electronic devices. For example, the touch screen system 1000 may be included in any kind of electronic device using a touch sensor, such as a smart phone 3100, a tablet computer 3200, a notebook computer 3300, a wearable device 3400, a fingerprint sensor 3500, a portable media player (PMP) 3600, an electronic book 3700, a navigation device 3800, or the like.

When an electronic device employs the touch processor circuit 1200 or the touch screen system 1000 according to an example embodiment of the present disclosure, an area occupied by the touch processor circuit 1200 may be reduced, and the touch processor circuit 1200 may consume a small amount of power. As a result, the electronic device may be implemented and operate efficiently.

Figure 15:
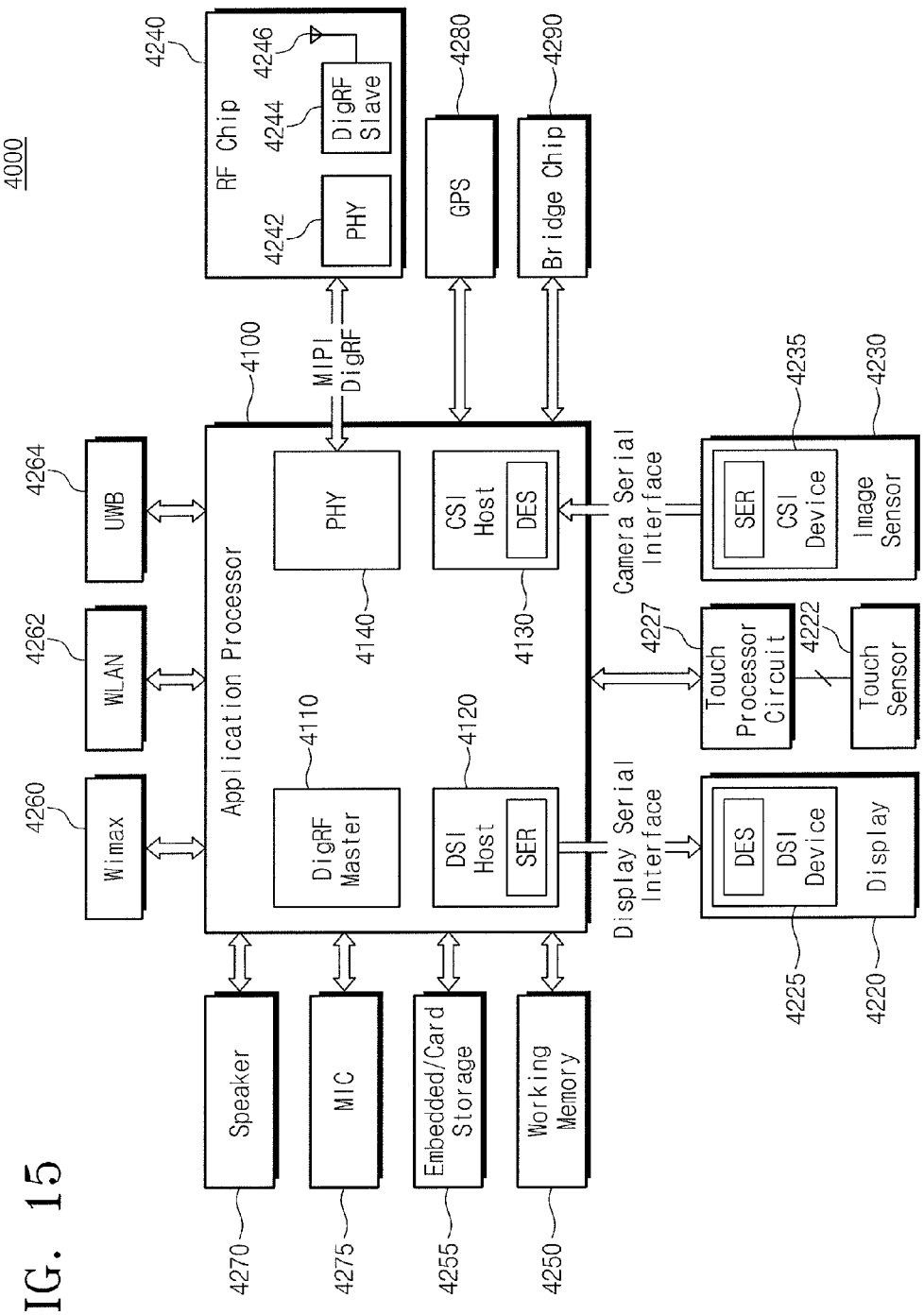
FIG. 15 illustrates a block diagram of an electronic system including a touch processor circuit according to an example embodiment and interfaces thereof.

FIG. 15 is a block diagram illustrating an electronic system including a touch processor circuit according to an example embodiment and interfaces thereof An electronic system 4000 may be implemented by a data processing device capable of using or supporting an interface proposed by a mobile industry processor interface (MIPI) alliance. For example, the electronic system 4000 may be implemented in an electronic device such as a portable communication terminal, a personal digital assistant (PDA), a PMP, a smart phone, a wearable device, or the like.

The electronic system 4000 may include an application processor 4100, a display 4220, a touch sensor 4222, a touch processor circuit 4227, and an image sensor 4230. The application processor 4100 may include a DigRF master 4110, a display serial interface (DSI) host 4120, a camera serial interface (CSI) host 4130, and a physical layer 4140.

The DSI host 4120 may communicate with a DSI device 4225 of the display 4220 in compliance with DSI. For example, an optical serializer SER may be implemented in the DSI host 4120, and an optical deserializer DES may be implemented in the DSI device 4225.

The touch sensor 4222 may be used to sense a contact or proximity of an object, similarly to the touch sensor 1100 of FIGS. 1 and 2. The touch sensor 4222 may include a capacitive sensor having a capacitance component varying in response to a contact or proximity of an object. For example, the touch sensor 4222 may be fabricated to be transparent, and may be disposed on the display 4220.

The touch processor circuit 4227 may be implemented based on the example embodiments described with reference to FIGS. 1 to 14. The touch processor circuit 4227 may convert a signal generated by the touch sensor 4222 into a digital value, and may provide the digital value to the application processor 4100. The application processor 4100 may calculate a position where a contact or proximity occurs and/or duration of time when a contact or proximity occurs, based on the digital value. The application processor 4100 may perform and process various operations based on the calculation result to provide a service to a user.

The touch processor circuit 4227 may directly digitize an output of the capacitance-to-voltage converter 1271 (refer to FIG. 3) without an analog accumulator. Moreover, the touch processor circuit 4227 may perform analog-to-digital conversion of two steps. According to the example embodiment, an area occupied by the touch processor circuit 4227 may be reduced, and the touch processor circuit 4227 may consume a small amount of power. As a result, electronic system 4000 may be efficiently implemented and may efficiently operate.

The CSI host 4130 may communicate with a CSI device 4235 of the image sensor 4230 in compliance with CSI. For example, an optical deserializer DES may be implemented in the CSI host 4130, and an optical serializer SER may be implemented in the CSI device 4235.

The electronic system 4000 may further include a radio frequency (RF) chip 4240 to communicate with the application processor 4100. The RF chip 4240 may include a physical layer 4242, a DigRF slave 4244, and an antenna 4246. For example, the physical layer 4242 of the RF chip 4240 and the physical layer 4140 of the application processor 4100 may exchange data with each other in compliance with DigRF interface proposed by the MIPI alliance.

The electronic system 4000 may further include a working memory 4250 and an embedded/card storage 4255. The working memory 4250 and the embedded/card storage 4255 may store data received from the application processor 4100. Moreover, the working memory 4250 and the embedded/card storage 4255 may provide the data stored therein to the application processor 4100.

The working memory 4250 may temporarily store data processed or to be processed by the application processor 4100. The working memory 4250 may include a volatile memory such as a static random access memory (SRAM), a dynamic RAM (DRAM), a synchronous DRAM (SDRAM), or the like, and/or a nonvolatile memory such as a flash memory, a phase-change RAM (PRAM), a magneto-resistive RAM (MRAM), a resistive RAM (ReRAM), a ferroelectric RAM (FRAM), or the like. The embedded/card storage 4255 may store data regardless of power supply.

The electronic system 4000 may communicate with an external system through a communication module, such as a worldwide interoperability for microwave access (WiMax) 4260, a wireless local area network (WLAN) 4262, an ultra-wideband (UWB) 4264, or the like. The electronic system 4000 may further include a speaker 4270 and a microphone 4275 for processing voice information. The electronic system 4000 may further include a global positioning system (GPS) device 4280 for processing position information. The electronic system 4000 may further include a bridge chip 4290 for managing connections with peripheral devices.

Circuits, chips, and devices according to an example embodiment of the present disclosure may be packaged by means of various kinds of semiconductor packages. For example, circuits, chips, and devices according to an example embodiment may be packaged using at least one of package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), metric quad flat pack (MQFP), thin quad flat pack (TQFP), small outline integrated circuit (SOIC), shrink small outline package (SSOP), thin small outline package (TSOP), system in package (SIP), multi-chip package (MCP), wafer-level fabricated package (WFP), wafer-level processed stack package (WSP), or the like.

According to the example embodiments of the present disclosure, an analog accumulator may be excluded from the touch processor circuit that processes a signal generated in response to sensing of the touch sensor, e.g., the signal generated by a touch or proximity sensor may be directly input to a converter. Accordingly, an area occupied by the touch processor circuit may be markedly reduced, and an amount of power consumed by the touch processor circuit may be greatly reduced. As a result, the touch screen system employing the touch processor circuit according to the example embodiments may be efficiently implemented and may efficiently operate.

The configuration shown in each of schematic diagrams is only to be understood just from a conceptual point of view. To help better understanding of the present disclosure, forms, structures, sizes, or the like of each component shown in each conceptual diagram have been exaggerated or reduced. A configuration actually implemented may have a different physical shape from that shown in each conceptual diagram. Each conceptual diagram is not intended to limit the physical shape or size of the components.

A device configuration shown in each block diagram is provided to help better understanding of the present disclosure. Each block may be formed of smaller blocks according to functions. Alternatively, a plurality of blocks may form a larger block according to a function. That is, the spirit or the scope of the present disclosure is not limited to the configuration shown in a block diagram.

Accordingly, a modified or altered technical concept without departing from the scope or the spirit of the present disclosure is included in the scope of the claims below. The scope of the present disclosure is not limited to the above example embodiments.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A touch processor circuit, comprising:
  a capacitance-to-voltage converter to convert an input signal into a conversion signal, the input signal being transmitted from a touch sensor, the conversion signal corresponding to a capacitance of the touch sensor; and an analog-to-digital converter to digitize the conversion signal transmitted from the capacitance-to-voltage converter to generate a digital value,
wherein the analog-to-digital converter includes:
a first converter to calculate upper bits of the digital value based on the conversion signal during a first time period, the first converter including
a noise filter to filter a low-frequency component of the conversion signal,
a subtractor to subtract a feedback signal from the conversion signal of which the low-frequency component is filtered such that a subtraction signal is generate,
an integrator to perform an integration operation on the subtraction signal such that an integration signal is generated,
a comparator to compare a reference signal with the integration signal such that a comparison signal is generated,
a digital-to-analog converter to convert the comparison signal into an analog signal such that the feedback signal is generated, and
a counter to generate the upper bits based on the comparison signal;
a second converter to calculate lower bits of the digital value based on a residue component signal during a second time period, the residue component signal being transmitted from the first converter, the second time period not overlapping with the first time period; and
a combination logic circuit to combine the upper bits and the lower bits such that the digital value is generated.

2. The touch processor circuit as claimed in claim 1, wherein the conversion signal has a voltage value varying according to variation of the capacitance.

3. The touch processor circuit as claimed in claim 1, wherein a number of the upper bits and a number of the lower bits are determined at least according to conversion capability of the first converter and conversion capability of the second converter, respectively.

4. The touch processor circuit as claimed in claim 1, wherein the upper bits do not overlap with the lower bits,
wherein the analog-to-digital converter further includes an amplification and offset controller to adjust amplitude and an offset of the residue component signal, and
wherein the second converter is to calculate the lower bits based on the residue component signal adjusted by the amplification and offset controller.

5. The touch processor circuit as claimed in claim 1, wherein the lower bits further includes an additional bit to compensate for an error due to a small gain characteristic of the first converter.

6. The touch processor circuit as claimed in claim 5, wherein the additional bit is in a bit position that overlaps a portion of the upper bits, in the digital value, and
wherein the combination logic circuit is to combine the upper bits and the lower bits including the additional bit such that the digital value is generated.

7. The touch processor circuit as claimed in claim 1, further comprising:
a switching circuit to control a connection between the capacitance-to-voltage converter and the analog-to-digital converter,
wherein the switching circuit is to,
connect the capacitance-to-voltage converter to the analog-to-digital converter such that the conversion signal is transmitted to the first converter during the first time period; and
disconnect the capacitance-to-voltage converter from the analog-to-digital converter such that the conversion signal is not transmitted to the first converter during the second time period.

8. The touch processor circuit as claimed in claim 1, wherein the integrator is further to output the residue component signal for the second converter.

9. The touch processor circuit as claimed in claim 1, wherein the first converter includes a differential amplifier, and
wherein each of signal input terminals of the differential amplifier alternately receives the conversion signal and a common mode signal in response to a clock signal having a same frequency as the input signal.

10. The touch processor circuit as claimed in claim 1, wherein the second converter includes a cyclic analog-to-digital conversion circuit.

11. A touch screen system, comprising:
a touch sensor including a sensing array that has a capacitance component;
a capacitance-to-voltage converter to convert an input signal into a conversion signal, the input signal being transmitted from the touch sensor, the conversion signal corresponding to a capacitance value of the capacitance component; and
an analog-to-digital converter to,
calculate upper bits of a digital value corresponding to the conversion signal through a first analog-to-digital conversion operation during a first time period;
calculate lower bits of the digital value based on a residue component signal output from the first analog-to-digital conversion operation through a second analog-to-digital conversion operation during a second time period, the second analog-to-digital conversion operation being separate from the first analog-to-digital conversion operation, the second time period not overlapping with the first time period; and
combine the upper bits and the lower bits such that the digital value is generated,
wherein the analog-to-digital converter receives the conversion signal during the first time period and does not receive the conversion signal during the second time period,
wherein the upper bits do not overlap with the lower bits,
wherein the analog-to-digital converter further includes an amplification and offset controller to adjust amplitude and an offset of the residue component signal, and
wherein the analog-to-digital converter is to calculate the lower bits based on the residue component signal adjusted by the amplification and offset controller.

12. The touch screen system as claimed in claim 11, wherein the first analog-to-digital conversion operation is performed in response to a first clock signal having a same frequency as the input signal.

13. The touch screen system as claimed in claim 12, wherein the second analog-to-digital conversion operation is performed in response to a second clock signal having a frequency higher than the frequency of the input signal.

14. An analog-to-digital converter to generate a digital value of a conversion signal that is converted from an input signal of a device including the analog to digital converter, the analog-to-digital converter comprising:
a first converter to calculate upper bits of the digital value based on the conversion signal during a first time period, the first converter including
a noise filter to filter a low-frequency component of the conversion signal, a subtractor to subtract a feedback signal from the conversion signal of which the low-frequency component is filtered such that a subtraction signal is generate, an integrator to perform an integration operation on the subtraction signal such that an integration signal is generated, a comparator to compare a reference signal with the integration signal such that a comparison signal is generated, a digital-to-analog converter to convert the comparison signal into an analog signal such that the feedback signal is generated, and a counter to generate the upper bits based on the comparison signal;

a second converter to calculate lower bits of the digital value based on a residue component signal during a second time period, the residue component signal being transmitted from the first converter, the second time period not overlapping with the first time period; and a combination logic circuit to combine the upper bits and the lower bits such that the digital value is generated.

15. The analog-to-digital converter as claimed in claim 14, wherein the first converter operates in response to a first clock signal and the second converter operates in response to a second clock signal having a higher frequency than then first clock signal.

16. The analog-to-digital converter as claimed in claim 15, wherein a frequency of the first clock signal is equal to a frequency of the input signal.

17. The analog-to-digital converter as claimed in claim 14, wherein the lower bits further includes an additional bit that overlaps with at least one of the upper bits.

18. The analog-to-digital converter as claimed in claim 14, wherein the first converter directly receives the conversion signal.

\* \* \* \* \*